(12) United States Patent
Ishida

(10) Patent No.: US 7,728,780 B2
(45) Date of Patent: Jun. 1, 2010

(54) ANTENNA DEVICE AND INFORMATION TERMINAL DEVICE

(75) Inventor: Masaaki Ishida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 205 days.

(21) Appl. No.: 12/129,087

(22) Filed: May 29, 2008

(65) Prior Publication Data

US 2008/0297422 A1 Dec. 4, 2008

(30) Foreign Application Priority Data

May 30, 2007 (JP) ............................ 2007-144030

(51) Int. Cl.
*H01Q 1/24* (2006.01)
*H01Q 1/48* (2006.01)

(52) U.S. Cl. ...................... 343/702; 343/846

(58) Field of Classification Search ................ 343/702, 343/700 MS, 846, 848
See application file for complete search history.

(56) References Cited

U.S. PATENT DOCUMENTS

| | | | | |
|---|---|---|---|---|
| 6,753,815 B2 * | 6/2004 | Okubora et al. | ....... | 343/700 MS |
| 6,985,111 B2 * | 1/2006 | Hara et al. | ................. | 343/702 |
| 7,236,070 B2 * | 6/2007 | Ajioka et al. | ................ | 333/247 |
| 7,372,408 B2 * | 5/2008 | Gaucher et al. | ....... | 343/700 MS |
| 7,583,237 B2 * | 9/2009 | Noro et al. | .................. | 343/860 |

FOREIGN PATENT DOCUMENTS

JP 2006-33076 2/2006

* cited by examiner

*Primary Examiner*—Hoang V Nguyen
(74) *Attorney, Agent, or Firm*—Oblon, Spivak, McClelland, Maier & Neustadt, L.L.P.

(57) ABSTRACT

An antenna device includes an antenna substrate 30 and a multilayer substrate 36 mounted on the antenna substrate 30. The antennal substrate 30 includes an insulating part 31, an antenna element 32 composed of a conductor pattern formed on a predetermined principal surface and a ground part 34 connected to the antenna element 32 electrically and formed on the principal surface. The multilayer substrate 36 includes a wiring pattern formed in an inside layer, an opening through which the wiring pattern is exposed on the side of one principal surface of the multilayer substrate 36, a plurality of through-holes formed so as to surround the opening and penetrate the inside layer of the multilayer substrate 36 while extending from the one principal surface and a ground layer 38 arranged to make contact with respective other ends of the through-holes and arranged in a position to interleave the wiring pattern against the opening. The antenna substrate 30 is electrically joined to the multilayer substrate 36 through the through-holes.

9 Claims, 9 Drawing Sheets

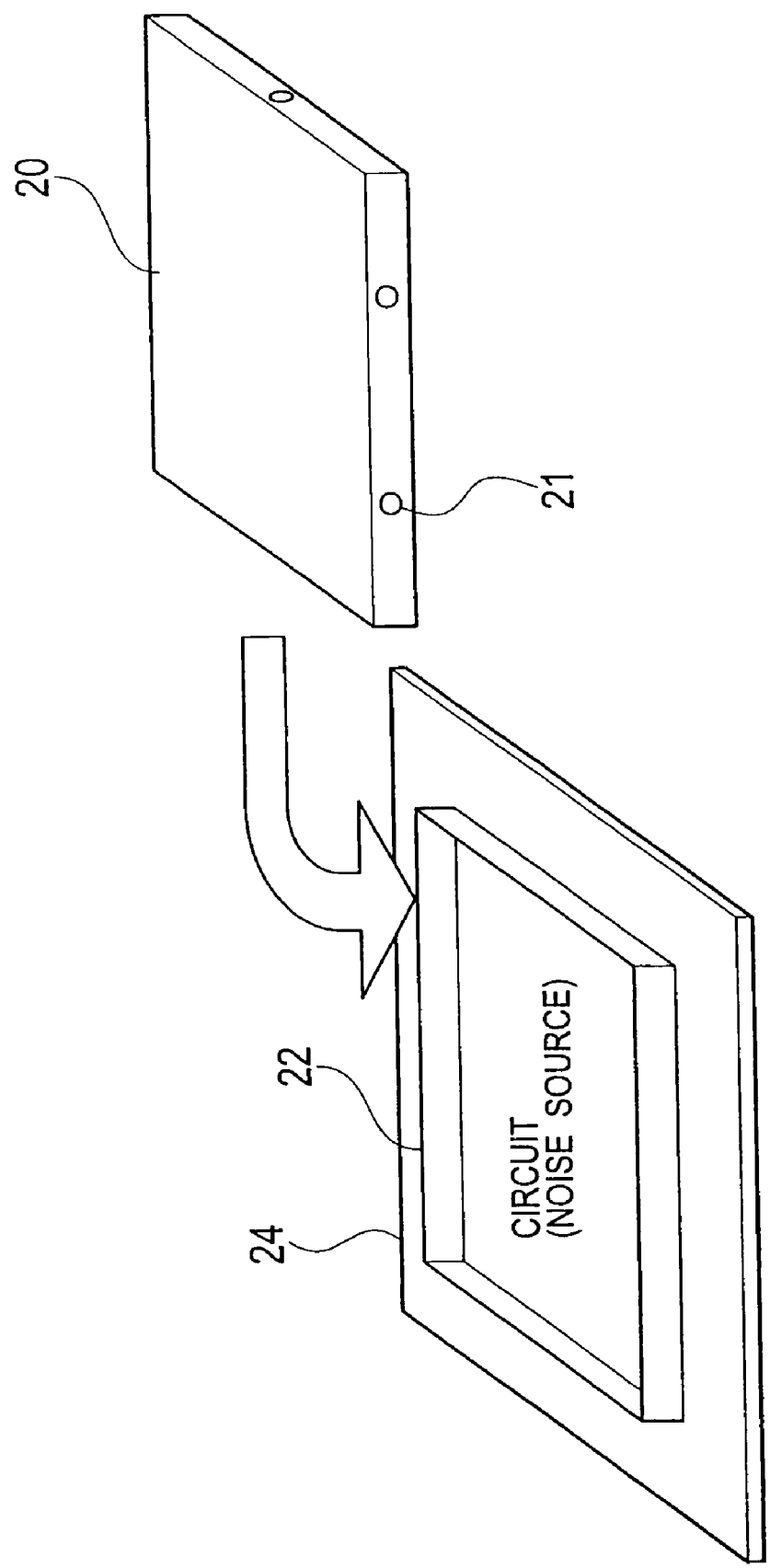

ANTENNA DEVICE AND INFORMATION TERMINAL DEVICE

BACKGROUND OF THE INVENTION

1. Field of the Invention

The present invention relates to an antenna device having an antenna for transmitting and receiving radio signals and also relates to an information terminal device equipped with the antenna device.

2. Description of the Related Art

With a dramatic development in the communication technology, a radio (wireless) system for an information terminal device, such as laptop computer and mobile telephone, has become popular explosively in recent years. Assuming that a laptop computer as the information terminal device has a multifunctional radio system on board, an antenna of the radio system is generally arranged on an upper part of a display unit sensitive to radio wave. Under such an arrangement, if the laptop computer has a transmitter-receiver circuit arranged in a main unit, then a distance from the antenna to the transmitter-receiver circuit (i.e. cables for connecting the antenna with the transmitter-receiver) is lengthened. As such an elongated cable is equivalent to a low pass filter (LPF), a high frequency signal in the gigahertz band, which is used by a radio device in a hopeful view of the information terminal device, becomes easy to be attenuated in the cable. That is, in view from the main unit of the radio device, the ratio of carrier signal to noise (C/N) in receiving the radio wave is reduced to deteriorate a noise figure (NF). Here, the noise figure designates a ratio of C/N at input to C/N at output.

As means for restricting the deterioration of N/F in the radio device, Japanese Patent Publication Laid-open No. 2006-33076 discloses an active antenna where both a signal reception line and a signal transmission line are arranged in the vicinity of the antenna and additionally, an amplifier is interposed in the signal reception line to amplify the radio signal on reception.

FIG. 1 is a bock diagram showing the schematic constitution of an active antenna. This active antenna includes an antenna 1, an active circuit 2 having a low noise amplifier 3 and a radio module 5. The active circuit 2 is connected to the radio module 5 by a signal line passing through a hinge 4. In transmitting, the active antenna produces a control voltage for switches in the active circuit 2 through the use of a transmission power on a single signal line connecting the active circuit 2 with the radio module 5, accomplishing a transmission in the route of avoiding the low noise amplifier 3. In receiving a radio signal, the active antenna changes the positions of the switches into the route of receiving the radio signal by a voltage superimposed on a signal on the signal line and further activates the low noise amplifier. In this way, the switching operation between transmission and reception of the radio signal can be accomplished by the above single signal line.

According to the active antenna mentioned above, since the radio signal on reception is amplified by the low noise amplifier 3 before being attenuated by the signal line, it is possible to suppress a reduction of C/N in spite of attenuation of the radio signal via the signal line. Consequently, it is possible to prevent deterioration of NF of the radio unit.

FIG. 2 is a view showing the constitution of a laptop computer 10. The laptop computer 10 comprises a display unit 12, hinge parts 14 and main unit 16. As shown in the figure, the display unit 12 is connected to the main unit 16 by the hinge parts 14 for effecting a relative rotation therebetween.

In the general laptop computer 10 constructed above, the antenna 1 of FIG. 1 is generally arranged in a sensitive upper part 11 of the display unit 12. The radio module 5 is arranged inside the main unit 16. Therefore, the cables connecting the active circuit 2 with the radio module 5 have to be wired so as to pass through the interior of the hinge parts 14.

Further, as the radio signal received by the antenna 1 in the upper part 11 would be attenuated in the course of transmitting into the radio module 5 through the cables, the active circuit 2 for amplifying the radio signal should be arranged inside the display unit 12, as similar to the antenna 1.

Thus, due to an arrangement behind a liquid crystal part forming the display unit 12, the active circuit 2 is required to be thin. Meanwhile, the active circuit 2 has to be provided with an electromagnetic shield structure for suppressing an influence of electromagnetic waves. If the active circuit 2 is provided with no electromagnetic shield structure, there is a possibility of problems in radio communication since the active circuit 2 is under the influence of noise produced from the liquid crystal part. Additionally, there may be produced problems in liquid crystal displaying since the distribution of lights in the liquid crystal part is disturbed by noise produced from the active circuit 2. After all, it is necessary that the active circuit 2 is thinned (low height) to have an electromagnetic shield structure.

FIG. 3 illustrates a conventional electromagnetic shield structure for a high frequency circuit, for example, the above active circuit 2. The illustrated shield structure comprises a substrate 24 having a shield frame 22 and a shield cover 20. The shield frame 22 made of metal is soldered onto the substrate 24 so as to realize an electrical connection between a ground layer (not shown) in the substrate 24 and the frame 22. In connection, the shield frame 22 is arranged so as to surround a not-shown circuit as a noise source. The shield cover 20 as a lid is also made of metal and overlaid on the shield frame 22. Again, the shield cover 20 is provided, on its side faces, with a plurality of emboss parts 21 at predetermined intervals. The emboss parts 21 constitute electrical contacts between the shield cover 20 and the shield frame 22. Each interval between the adjoining emboss parts 21 is smaller than a half wavelength of an electromagnetic wave as an object to be shielded. With this arrangement of the emboss parts 21, the circuit(s) surrounded by the shield frame 22 can be protected from the outside electromagnetic wave and additionally, an electromagnetic wave originating in the inside circuit(s) can be prevented from leaking out.

FIGS. 4A and 4B are sectional views showing the above-mentioned electromagnetic shield structure. As shown in FIG. 4A, the shield frame 22 is soldered onto the substrate so as to be electrically connected to the ground layer 28 embedded in the substrate 24. The above high frequency circuit 26 is mounted on the substrate 24. As shown in FIG. 4B, the high frequency circuit 26 is electromagnetically shielded by the shield cover 20 since it is overlaid on the shield frame 22 while engaging the emboss parts 21 in openings (or recesses) 23 formed in the shield frame 22. In this way, by the shield structure comprising the shield cover 20, the shield frame 22, the emboss parts 21 and the ground layer 28, it is possible to protect the high frequency circuit 26 from the outside electromagnetic wave and also possible to prevent the electromagnetic wave in the circuit 26 from leaking out.

SUMMARY OF THE INVENTION

In the above-mentioned shield structure, however, it is necessary to ensure a gap between the shield cover 20 and the high frequency circuit 26 in order to avoid an electrical conduction of cables on the circuit 26 to ground. Even if the cables are covered with insulating material in the above view, the contact between the shield cover 20 and the high frequency circuit 26 would cause the engagement of the emboss parts 21 with the shield frame 22 to be destabilized to raise a possibility of leakage of the electromagnetic wave through a clearance between the cover 20 and the frame 22, causing problems in radio communication and liquid crystal displaying. From this point of view, the shield structure in its assembled state has to be provided, between the shield cover 20 and the high frequency circuit 26, with a certain gap which causes a whole thickness of the assembled structure to be increased more than 2 mm, as shown in FIG. 4B.

Even if the emboss parts 21 are soldered to the shield frame 22 for the purpose of improving an engagement therebetween, the manufacturing of the shield structure would be costly and troublesome while remaining the above issue in thickness of the assembled structure.

In the above-mentioned situation, it is an object of the present invention to provide a thin antenna device for use in radio communication and an information terminal device having the antenna device.

In order to attain the above object, according to the present invention, there is provided an antenna device comprising: an antenna substrate; and a multilayer wiring substrate mounted on the antenna substrate, wherein the antennal substrate includes an insulating part, an antenna element part composed of a conductor pattern formed on a predetermined principal surface of the insulating part and a ground pattern part connected to the antenna element part electrically and formed on the principal surface, and the multilayer wiring substrate includes a wiring pattern formed in an inside layer of the multilayer wiring substrate, an opening through which the wiring pattern is exposed on the side of one principal surface of the multilayer wiring substrate, a plurality of through-holes formed so as to surround the opening and penetrate the inside layer of the multilayer wiring substrate while extending from the one principal surface, the through-holes having respective one ends arranged to make contact with the ground pattern part of the antenna substrate and a ground pattern layer arranged to make contact with respective other ends of the through-holes and also arranged in a position to interleave the wiring pattern against the opening, and wherein the antenna substrate is electrically joined to the multilayer substrate through the through-holes.

Furthermore, according to the present invention, there is also provided an antenna device comprising: an antenna substrate having an antenna element and a ground part connected to the antenna element; and a multilayer substrate having a built-in high frequency circuit, a plurality of ground vias and a ground layer, wherein the ground part is arranged in a position to oppose the ground layer through the high frequency circuit, and the ground vias are formed to penetrate the multilayer substrate thereby connecting the ground part with the ground layer electrically and are arranged so as to surround the high frequency circuit.

Still further, according to the present invention, there is provided an information terminal device comprising: a first casing part having either the former antenna device or the latter antenna device and a display part both built-in; a second casing part having a built-in processing part for producing information to be displayed on the display part; and a connecting part connecting the first casing part with the second casing part so as to allow a relative rotation therebetween, wherein the antenna device comprises an antenna substrate and a multilayer substrate mounted on the antenna substrate.

BRIEF DESCRIPTION OF THE DRAWINGS

FIG. 3 is a view showing a conventional electromagnetic shield structure against a high-frequency circuit, such as active circuit;

DETAILED DESCRIPTION OF THE PREFERRED EMBODIMENTS

Embodiments of an antenna device and an information terminal device of the present invention will be described with reference to attached drawings in detail.

Figure 5:
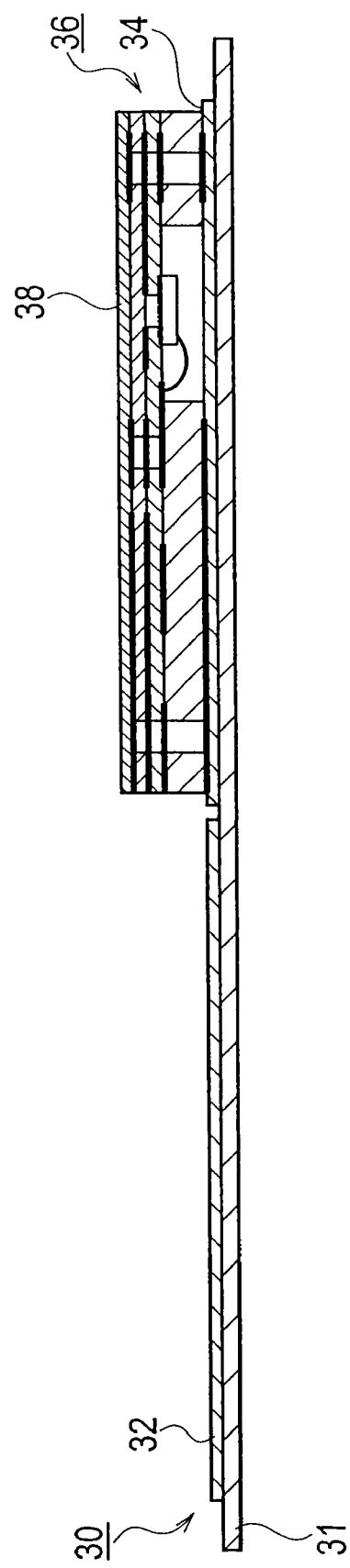
FIG. 5 is a sectional view showing the constitution of an antenna device in accordance with a first embodiment of the present invention.

FIG. 5 is a sectional view of the constitution of an antenna device in accordance with a first embodiment of the present invention. As shown in FIG. 5, the antenna device comprises an antenna substrate 30 and a multilayer substrate 36. For example, the antenna substrate 30 is made of polyimide and comprises an insulating part 31, an antenna element 32 and a ground part 34. The multilayer substrate 36 includes a ground layer 38.

Corresponding to an antenna element part of the invention, the antenna element 32 comprises an antenna printed with e.g. copper pattern and is formed by a conductive pattern formed on a designated principal surface of the insulating part 31. The insulating part 31 corresponds to an insulating substrate of the invention. Corresponding to a ground pattern part of the invention, the ground part 34 is electrically connected to the antenna element 32 and formed by a ground pattern on a principal surface of the insulating part 31. Normally, an antenna used for an information terminal device, such as laptop computer and mobile telephone, is a monopole antenna which requires a wide conductor plate (ground layer) in order to ensure an equivalent characteristic to a dipole antenna. In the embodiment, the antenna element 32 requires the ground part 34 formed by a wide conductor plate due to the monopole antenna.

The multilayer substrate 36 corresponding to a multilayered substrate of the present invention is arranged on the surface of the ground part 34 and includes a high frequency circuit and a ground layer 38. The details of the multilayer substrate 36 will be described later.

Figure 6:
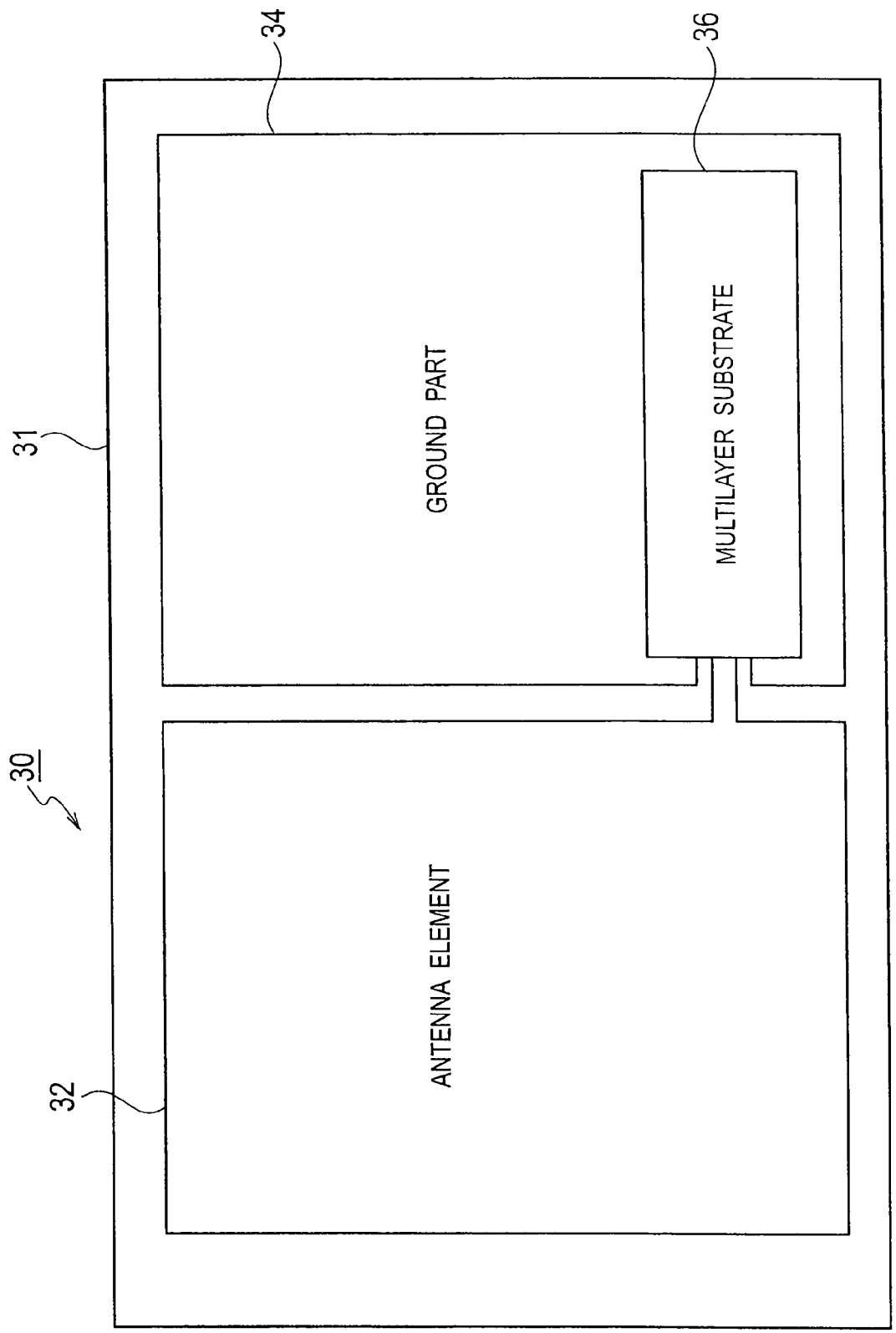
FIG. 6 is a sectional view showing the constitution of the antenna device of the first embodiment of the present invention, viewed from an upside of the device.

FIG. 6 is a view showing the constitution of the antenna device of the first embodiment, viewed from the upside. The antenna element 32 and the ground part 34 are together arranged on the insulating part 31. Further, the multilayer substrate 36 is arranged on the ground part 34.

Figure 2:
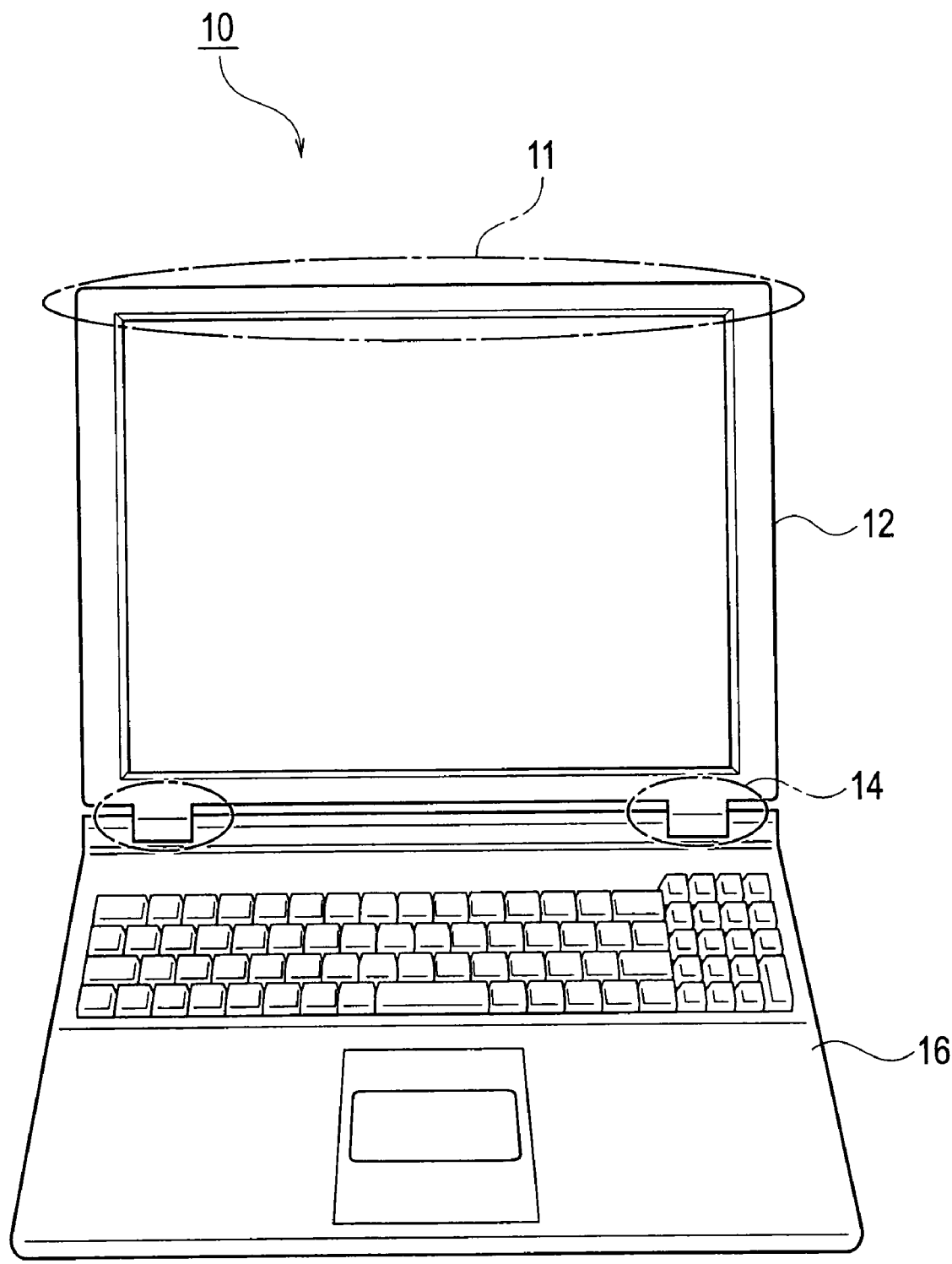
FIG. 2 is a view showing the constitution of a general laptop computer.

In an arrangement where the antenna device of the invention is applied to a laptop computer, the antenna element 32 is arranged in the upper part 11 of the laptop computer 10 of FIG. 2, as mentioned above. Thus, the ground part 34 and the multilayer substrate 36 of FIG. 6 are arranged on the backside of the liquid crystal part forming the display unit 12. Note, even when applying the antenna device to the other information terminal devices, such as mobile telephone, the multilayer substrate 36 and the ground part 34 are arranged on the backside of the liquid crystal part.

FIG. 3 is a sectional view showing the detailed constitution of the multilayer substrate 36 of the antenna device in accordance with the first embodiment of the present invention. The multilayer substrate 36 is arranged on the surface of the ground part 34 of the antenna substrate 30 and includes a cavity part 41 defined by opening a part of the substrate over one or more layers, a ground layer 38 and a plurality of ground vias 50. In the embodiment, the multilayer substrate 36 comprises a first substrate 44, a second substrate 46, a third substrate 48 and the ground layer 38 in lamination. The cavity part 41 is defined by opening a part of the first substrate 44.

Thus, the ground part 34 is arranged so as to oppose the ground layer 38 through the cavity part 41 and seal up the cavity part 41.

The cavity part 41 corresponds to an opening of the invention. The cavity part 41 is arranged on the side of one principal surface of the multilayer substrate 36 and exposes a wiring pattern formed on an inside layer.

Figures 4A, 4B:
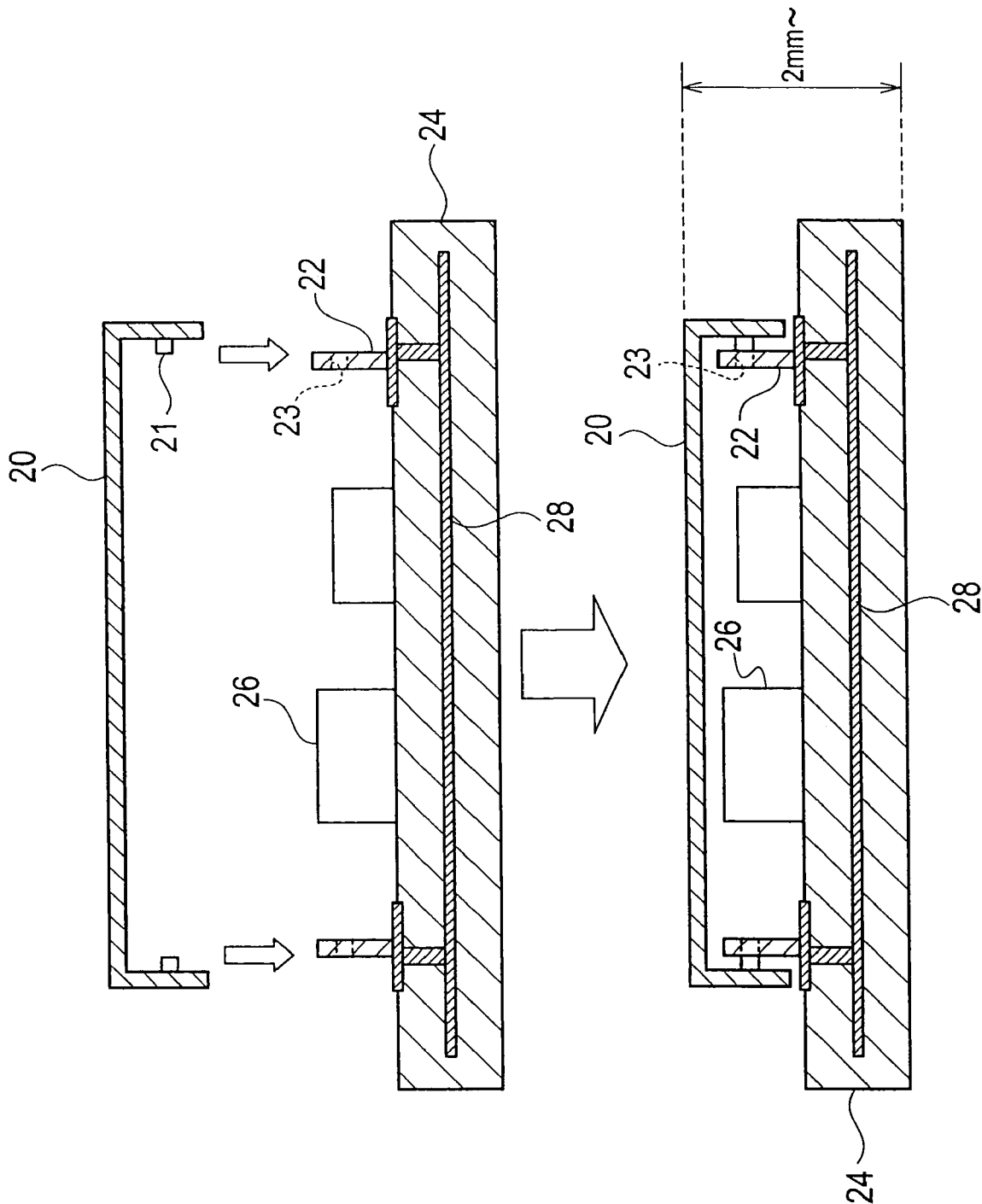
FIGS. 4A and 4B are sectional views of the conventional electromagnetic shield structure.

The high frequency circuit 40 is accommodated in the cavity part 41 and has a thickness smaller than the depth of the part 41. On the contrary, if the thickness of the high frequency circuit 40 is larger than the depth of the cavity part 41, the shield structure of the relevant antenna device could not be covered with the ground part 34 in the form of a flat plate shown in FIG. 7. In such a case, there would be required a shield cover 20 having emboss parts 21 shown in FIGS. 3 and 4, staying unchanged against the prior art.

As the present invention is characterized by a unit mounted on the ground part 34 of the printed antenna, which is formed by a thin substrate of polyimide etc. in heavy usage of laptop computers etc., it is required that the high frequency circuit 40 is formed with a thickness smaller than the depth of cavity part 41.

Figure 7:
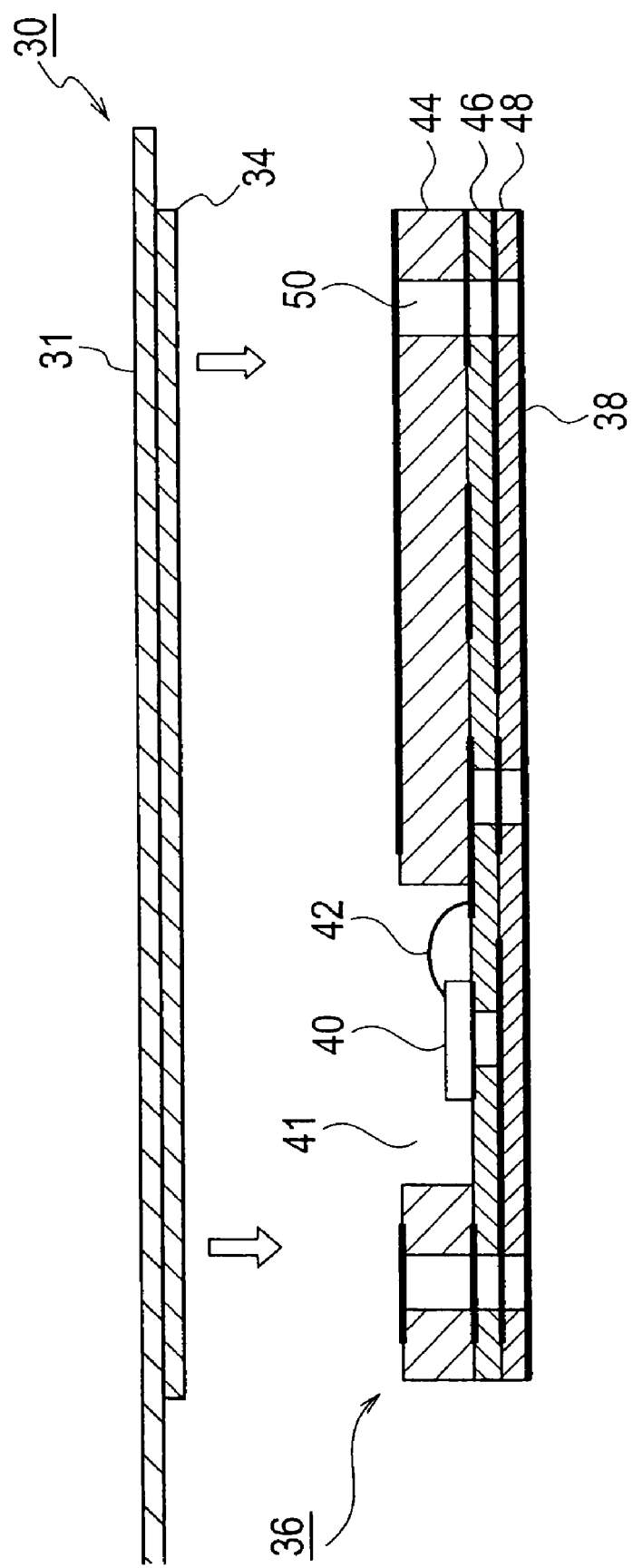
FIG. 7 is a sectional view showing the detailed constitution of a multilayer substrate of the antenna device of the first embodiment of the present invention.

The high frequency circuit 40 is connected to the wiring pattern of the multilayer substrate 36 by a wire bonding 42, such as metal wire. Although FIG. 7 illustrates a single wire as the wire bonding 42, there exist a plurality of wires corresponding to the number of required signals actually.

Corresponding to a ground pattern layer of the invention, the ground layer 38 is arranged in the multilayer substrate 36 in a position to oppose the ground layer 34 through the high frequency circuit 40. Although the second substrate 46 and the third substrate 48 are arranged between the ground layer 38 and the high frequency circuit 40 in the shown embodiment, there may be a desired number of layers therebetween.

Each of the ground vias 50 corresponds to a through-hole of the invention and includes one end electrically connected to the ground part 34. By extending from one principal surface of the multilayer substrate 36 so as to penetrate its inner layers, the ground vias 50 serve to connect the ground part 34 with the ground layer 38 electrically. Further, the ground vias 50 are arranged so as to surround the cavity part 41, that is, the high frequency circuit 40 accommodated therein. Thus surrounding the high frequency circuit 40, the ground vias 50 as plural are arranged at regular intervals. For instance, a designer would design a plurality of ground vias 50 surrounding the high frequency circuit 40 at certain intervals each shorter than a half wavelength of an electromagnetic wave having a minimum wavelength of various noises produced from the circuit 40. Consequently, the shield structure formed by the ground part 34, the ground layer 38 and the ground vias 50 can accommodate the high frequency circuit 40 so as not to exert an influence of electromagnetic waves (noises) from the circuit 40 on the outside.

Therefore, it is necessary that when assembling, the ground part 34 is mounted on the multilayer substrate 36 so as to achieve an electrical connection with the ground vias 50 in the multilayer substrate 36. On the other hand, the ground vias 50 are previously arranged so as to be electrically connected to the ground layer 38 from the production stage of the multilayer substrate 36.

As mentioned above, respective one ends of the ground vias 50 are electrically connected to the ground part 34. The ground layer 38 shunts the other ends of the ground vias 50 electrically and is positioned so as to interleave the wiring pattern against the cavity part 41.

Further, the antenna substrate 30 and the multilayer substrate 36 are joined to each other electrically by the ground part 34 and the respective one ends of the ground vias 50.

Assuming in the above-constructed shield structure that the multilayer substrate 36 has a thickness of 0.8 mm and the antenna substrate 30 having the ground part 34 as a cover conductor has a thickness of 0.1 mm, the thickness of the shield structure as a whole will be 0.9 mm, which is thinner than the conventional shield structure usually having 2 mm or more in thickness.

Figure 1:
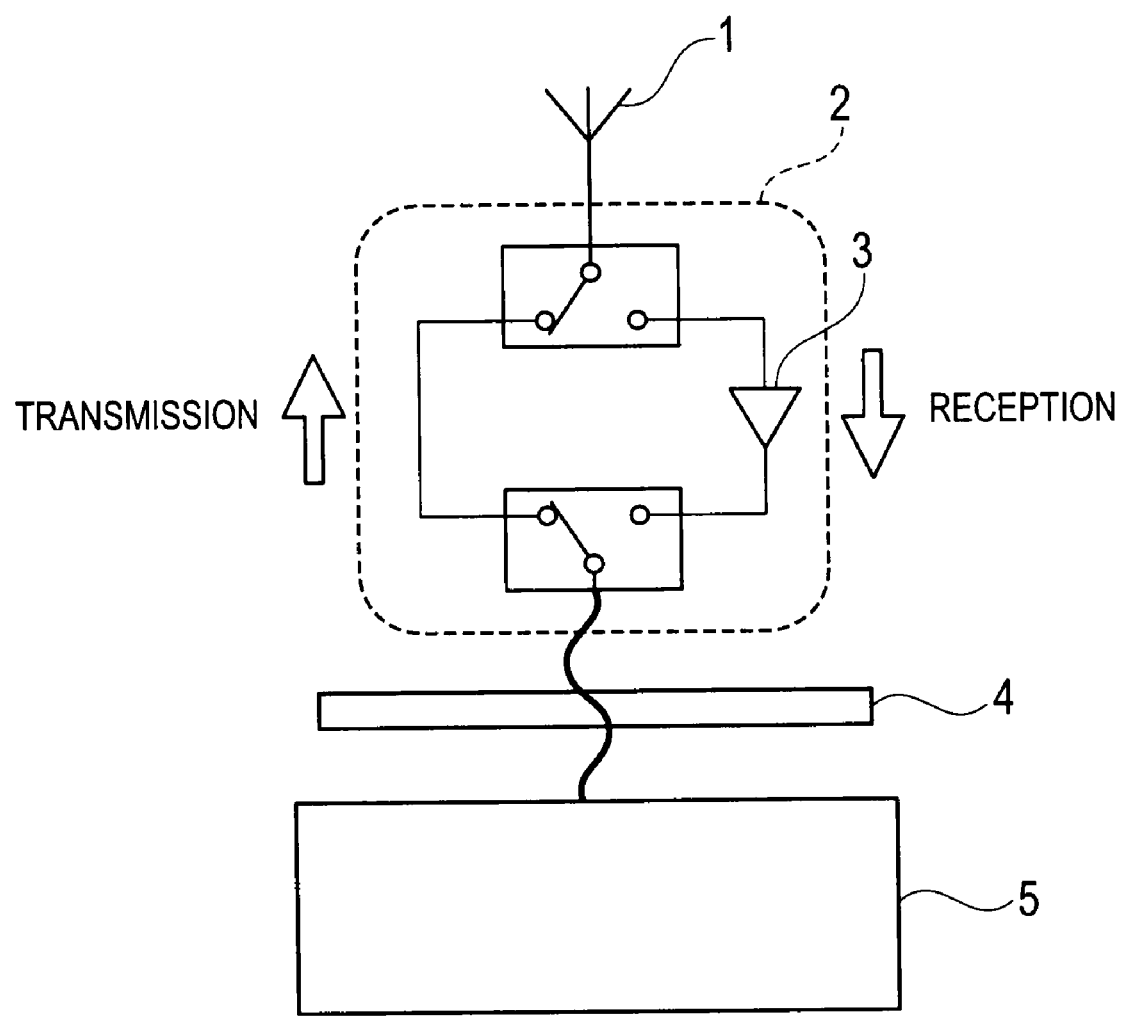
FIG. 1 is a block diagram showing the schematic constitution of an active antenna.

The above-constructed antenna device of this embodiment operates as follows. Suppose, in this embodiment, the antenna device is applied to the laptop computer 10 as shown in FIG. 2 and also adopts the active circuit 2 as shown in FIG. 1.

In the embodiment, the display unit 12 corresponds to a first casing part of the invention and includes the antenna device of the present invention and a display part, such as liquid crystal, both built-in. The main unit 16 corresponds to a second casing part of the invention and has a built-in processing part for generating information to be displayed on the display part unit. The hinge parts 14 correspond to a connecting part of the invention.

The illustrated laptop computer 10 corresponds to an information terminal device of the invention and is available in the market. Thus, the main unit 16 includes a central processing unit (CPU) for calculating data to produce image data. The CPU corresponds to a processing part of the invention. The display unit 12 includes the display part to display the image data produced by the CPU on the unit 12. The display unit 12 and the main unit 16 are connected to each other by the hinge parts 14 so as to allow a relative rotation between the unit 12 and the unit 16.

In the general laptop computer 10, the antenna element 32 of FIG. 5 is generally arranged in the sensitive upper part 11 of the display unit 12. The radio module 5 is arranged inside the main unit 16. Therefore, the cables have to be wired so as to pass through the interior of the hinge parts 14.

Further, as the radio signal received by the antenna element 11 in the upper part 11 would be attenuated in the course of transmitting into the radio module 5 through the cables, the active circuit 2 for amplifying the radio signal should be arranged inside the first casing part (i.e. the display unit 12 of this embodiment), as similar to the antenna element 12. Thus, in the laptop computer 10 comprising the display unit 12, the main unit 16 and the hinge parts 14, the active circuit 2 is arranged behind the display part of the display unit 12.

In the embodiment, the above high frequency circuit 40 corresponds to the active circuit 2 of FIG. 1 and includes the low noise amplifier 3 for amplifying the radio signal received through the antenna element 32 and the switches for selecting either a transmission route for transmitting a transmission signal for the antenna element 3 or a reception route for transmitting the radio signal via the low noise amplifier 3. It is noted that the low noise amplifier 3 corresponds to an amplifier of the invention. The active circuit 2 is formed on a wiring pattern exposed in the cavity part 41.

In this way, since the active circuit 2 is accommodated in the shield structure formed by the ground part 34, the ground layer 38 and the ground vias 50, it is possible to prevent electromagnetic waves (noise) due to switching of the active circuit 2 and electromagnetic waves (noise) of frequency of a carrier for radio communication from leaking out to influence on the display part of the display unit 12 and also possible to prevent an occurrence of defective radio communication caused by the active circuit 2 under the influence of exterior electromagnetic waves (noise).

The present invention is also applicable to a foldaway mobile telephone, although the above embodiment is directed to the application for the laptop computer 10. As for the positioning of the display part, it may be arranged on the side of either the ground part 34 or the ground layer 38.

Now, we describe another case besides the application of the present invention to the active circuit 2. If the display unit 12 could accommodate the radio module 5 of FIG. 2, there would be no need of providing the cables passing through the hinge parts and additionally, the active circuit 2 would be dispensable due to no attenuation of radio signal in the transmission route from the antenna element 32 to the radio module 5. Then, the high frequency circuit 40 is equivalent to the radio module 5 carrying out at least either modulation or demodulation of signals by use of a carrier wave within a predetermined frequency band. The radio module 5 corresponds to a radio communication control part of the present invention. Therefore, the radio module 5 is arranged in the laptop computer 10 having the display unit 12, the main unit 16 and the hinge parts 14 and positioned behind the display part of the display unit 12. Again, the radio module 5 is formed on the wiring pattern exposed to the cavity part 41.

Thus, by providing a thin antenna device having the radio module 5 as the high frequency circuit 40, it is possible to eliminate the need for the active circuit 2 and the cables passing through the hinge parts 14.

According to the antenna device of the first embodiment of the invention, it is possible to produce thin antenna components since the antenna substrate 30 is separated from the multilayer substrate 36 (as the multilayer wiring substrate) while being formed by the insulating part 31, the antenna element 32 and the ground part 34 (as a ground pattern for supplying such a flat antenna with electrical charge) juxtaposed to the antenna element 32. As mentioned above, the high frequency component in the recess (i.e. the high frequency circuit 40 in the cavity part 41) is blocked up by the ground part 34 of the antenna substrate 30 and additionally, the antenna device is constructed so as to block off the leakage of the radio wave from the high frequency component, in cooperation with the ground layer 38 in the multilayer substrate 36 and the through-holes (the ground vias 50) arranged at regular intervals in accordance with the frequency to be handled. Therefore, with this arrangement, it is possible to provide the thin-model antenna device exhibiting high versatility.

That is, as the ground part 34, the ground layer 38 and the ground vias 50 constitute a shield structure for surrounding the cavity part 41 (i.e. the high frequency circuit 40 accommodated therein) to thereby prevent a leakage of electromagnetic wave (noise) originating in the high frequency circuit 40 to the outside, it is possible to prevent the noise from influencing on the display part of the display unit 12. Additionally, as the high frequency circuit 40 per se is shielded from external electromagnetic waves (noise), it is possible to prevent an occurrence of problem in the radio communication.

Further, since the shield structure is provided by use of the multilayer substrate 36 having the cavity part 41 formed therein, the resulting antenna device can be formed thinly and strongly to vertical pressing (i.e. pressures applied on the ground part 34 and the ground layer 38 in the vertical direction).

As the ground part 34 being a wide conductor plate essential to a monopole antenna is adopted as the lid for the shield structure, it is possible to promote more effective use of the ground part 34 and also possible to make the shield structure thin.

According to the first embodiment, for information terminal devices minimized with flexibility (e.g. laptop computer, mobile telephone), the antenna device enables a thin shield structure accommodating the high frequency circuit 40 essential to radio communication to be installed behind the liquid crystal display part.

In connection, it is noted that high frequency components for inside packaging may be selected depending on the usage of the antenna device appropriately. For instance, with the adoption of the active circuit 2 as the high frequency circuit 40, the antenna device can be realized with high sensitivity and wide communication area.

On the other hand, in the antenna device comprising the radio module 5 as the high frequency circuit 40, as it eliminates the need for the active circuit 2 and cables etc., it is possible to save the manufacturing cost of the antenna device and promote more effective use of a limited space.

2nd. Embodiment

Figure 8:
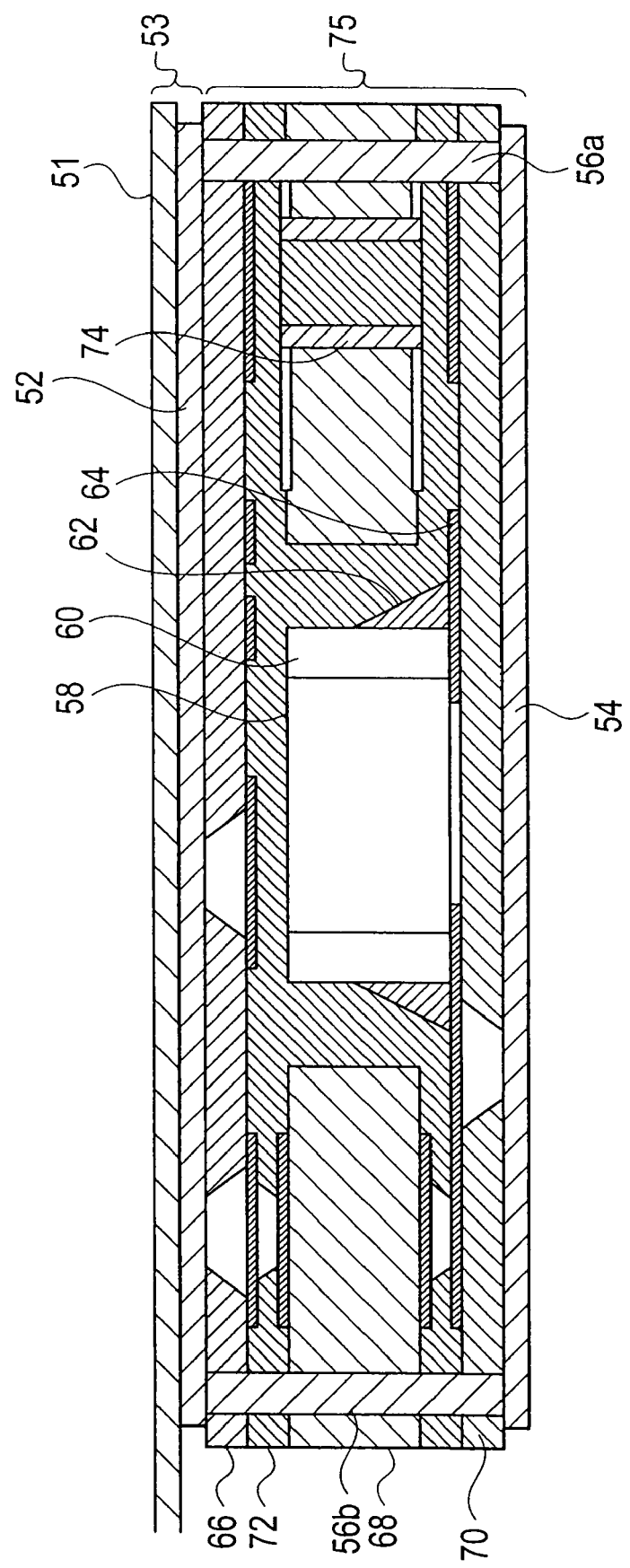
FIG. 8 is a view showing the constitution of a multilayer substrate of the antenna device of a second embodiment of the present invention.

FIG. 8 is a view showing a multilayer substrate 75 of the antenna device in accordance with the second embodiment of the present invention. In the second embodiment, the antenna device includes an antenna substrate 53 and the multilayer substrate 75.

The antenna substrate 53 includes a not-shown antenna element, a ground part 52 connected to the antennal element and an insulating part 51.

In FIG. 8, the multilayer substrate 75 comprises a substrate 66, a substrate 68, a substrate 70 and a ground layer 54, all in lamination. The multilayer substrate 75 has a plurality of ground vias (56a, 56b) and a built-in IC (integrated circuit) chip 58 arranged in an opened part of the substrate 68. The IC chip 58 on the substrate 70 corresponds to the high frequency circuit of the present invention and is fixed by solders 62 connecting poles 60 with wirings 64.

Further, respective substrates are joined with each other through resin 72. In the multilayer substrate 74 of FIG. 8, through-holes 74 are also filled up with resin.

The ground part 52 is arranged in a position to oppose the ground layer 54 through the IC chip 58.

The multilayer substrate 75 is arranged on the surface of the ground part 52 of the antenna substrate 53. The ground vias 56a, 56b penetrate the multilayer substrate 75 to connect the ground part 52 with the ground layer 54 electrically and are arranged so as to surround the IC chip 58. Although only the ground vias 56a, 56b are illustrated in FIG. 4 because of its viewing in cross section, there are actually arranged a plurality of ground at regular intervals so as to surround the IC chip 58. The same is equally true of the arrangement of the first embodiment.

The second embodiment is similar to the first embodiment in that the IC chip 58 may be equivalent to either the active circuit 2 or the radio module 5 of FIG. 1. Additionally, as similar to the first embodiment, the IC chip 58 is provided in a mobile information terminal device having a first casing part, a second casing part and joint parts for connecting the first casing part with the second casing part in relative rotation and also arranged behind a display part of the mobile information terminal device.

The second embodiment is different from the first embodiment in that the IC chip 58 as the high frequency circuit is completely built in the multilayer substrate 75 and also surrounded by the resin 72. The other constitution and operation are similar to those of the first embodiment and therefore, overlapping descriptions are eliminated.

Thus, in spite of the structure where the IC chip 58 requiring shielding is fully built in the multilayer substrate 75, it is possible to attain similar effects to the first embodiment since the ground part 52 and the ground layer 54 are arranged so as to oppose each other while interposing the IC chip 58 therebetween and further, the ground vias 56a, 56b electrically connecting the ground part 52 with the ground layer 54 are arranged so as to surround the IC chip 58 at regular intervals.

Figure 9:
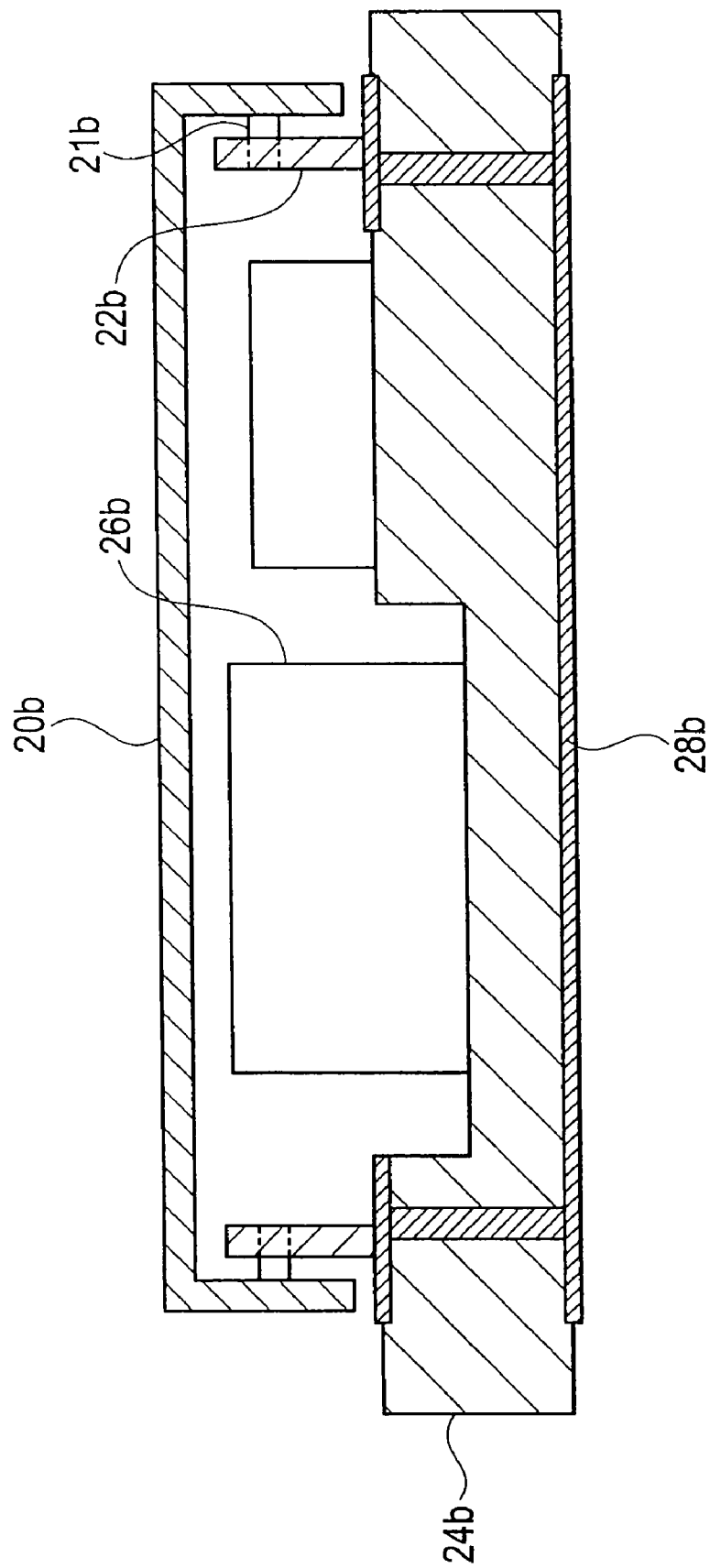
FIG. 9 is a view showing a shield structure where the thickness of a high-frequency circuit of the antenna device of the first embodiment is larger than a depth of a cavity part in the multilayer substrate.

In connection, FIG. 9 is a view showing a shield structure where a high frequency circuit 26b has a thickness larger than the depth of a cavity part in a multilayer (or single layer) substrate 24b. In this case, as similar to the prior art of FIGS. 3, 4A and 4B, there would be required a three-dimensional shield cover 20b as shown in the figure. Nevertheless, as the multilayer substrate 24 is provided with a cavity part, it is possible to provide a thin shield structure in comparison with the conventional structure.

Accordingly, if arranging the multilayer substrate 24b on a ground part 28b of a print antenna, then it becomes possible to arrange the resultant assembly (i.e. this antenna device) behind a display part of a mobile information terminal device.

In this way, the present invention is applicable to an antenna device used in an information terminal device accommodating an antenna, for example, laptop computers mobile telephones and so on.

Finally, it will be understood by those skilled in the art that the foregoing descriptions are nothing but two embodiments of the disclosed antenna device and therefore, various changes and modifications may be made within the scope of claims.

This application is based upon the Japanese Patent Applications No. 2007-144030, filed on May 30, 2007, the entire content of which is incorporated by reference herein.

What is claimed is:

1. An antenna device comprising:
an antenna substrate; and
a multilayer wiring substrate mounted on the antenna substrate,
wherein the antennal substrate includes an insulating part, an antenna element part composed of a conductor pattern formed on a predetermined principal surface of the insulating part and a ground pattern part connected to the antenna element part electrically and formed on the principal surface, and
the multilayer wiring substrate includes a wiring pattern formed in an inside layer of the multilayer wiring substrate, an opening through which the wiring pattern is exposed on the side of one principal surface of the multilayer wiring substrate, a plurality of through-holes formed so as to surround the opening and penetrate the inside layer of the multilayer wiring substrate while extending from the one principal surface, the through-holes having respective one ends arranged to make contact with the ground pattern part of the antenna substrate, and a ground pattern layer arranged to make contact with respective other ends of the through-holes and also arranged in a position to interleave the wiring pattern against the opening, and
wherein the antenna substrate is electrically joined to the multilayer substrate through the through-holes.

2. The antenna device of claim 1, wherein:
the wiring pattern is formed with an active circuit which includes an amplifier for amplifying a radio signal received by the antenna element part and switches for selecting either a transmission route for transmitting a transmission signal for the antenna element part or a reception route for transmitting the radio signal via the amplifier.

3. The antenna device of claim 1, wherein:
the wiring pattern has a radio communication control part formed thereon to at least either modulate or demodulate signals by use of a carrier wave within a predetermined frequency band.

4. The antenna device of claim 1, wherein
the through-holes are formed so as to surround the opening at regular intervals.

5. An antenna device comprising:
an antenna substrate having an antenna element and a ground part connected to the antenna element; and
a multilayer substrate having a built-in high frequency circuit, a plurality of ground vias and a ground layer,
wherein the ground part is arranged in a position to oppose the ground layer through the high frequency circuit, and
the ground vias are formed to penetrate the multilayer substrate thereby connecting the ground part with the ground layer electrically and are arranged so as to surround the high frequency circuit.

6. The antenna device of claim 5, wherein
the antenna substrate further includes an insulating part in the form of a plate, and
the antenna element and the ground part are together mounted on the insulating part.

7. The antenna device of claim 5, wherein
the ground vias are formed so as to surround the high frequency circuit at regular intervals.

8. An information terminal device comprising:
a first casing part having an antenna device and a display part both built-in;
a second casing part having a processing part built-in for producing information to be displayed on the display part; and
a connecting part connecting the first casing part with the second casing part so as to allow a relative rotation therebetween,
wherein the antenna device comprises an antenna substrate and a multilayer substrate mounted on the antenna substrate,
the antennal substrate includes an insulating substrate, an antenna element part composed of a conductor pattern formed on a predetermined principal surface of the insulating substrate and a ground pattern part connected to the antenna element part electrically and formed on the principal surface, the multilayer wiring substrate includes a wiring pattern formed in an inside layer of the multilayer wiring substrate, an opening through which the wiring pattern is exposed on the side of one principal surface of the multilayer wiring substrate, a plurality of through-holes formed so as to surround the opening and penetrate the inside layer of the multilayer wiring substrate while extending from the one principal surface, the through-holes having respective one ends arranged to make contact with the ground pattern part of the antenna substrate and a ground pattern layer arranged to make contact with respective other ends of the through-holes and also arranged in a position to interleave the wiring pattern against the opening, and the antenna substrate is electrically joined to the multilayer substrate through the through-holes.

9. An information terminal device comprising:

a first casing part having an antenna device and a display part both built-in;

a second casing part having a built-in processing part for producing information to be displayed on the display part; and a connecting part connecting the first casing part with the second casing part so as to allow a relative rotation therebetween, wherein the antenna device comprises an antenna substrate having an antenna element and a ground part connected to the antenna element, and a multilayer substrate having a built-in high frequency circuit, a plurality of ground vias and a ground layer, the ground part is arranged in a position to oppose the ground layer through the high frequency circuit, and wherein the ground vias are formed to penetrate the multilayer substrate thereby connecting the ground part with the ground layer electrically and are arranged so as to surround the high frequency circuit.

* * * * *